United States Patent [19]

Williams

[11] Patent Number: 5,324,976
[45] Date of Patent: Jun. 28, 1994

[54] PHONON CONTROLLED CONDUCTIVITY DEVICE

[75] Inventor: David A. Williams, Cambridge, United Kingdom

[73] Assignee: Hitachi, Ltd., Tokyo, Japan

[21] Appl. No.: 964,694

[22] Filed: Oct. 22, 1992

[30] Foreign Application Priority Data

Oct. 23, 1991 [GB] United Kingdom ................. 9122483

[51] Int. Cl.$^5$ ...................... H01L 29/66; H01L 29/96
[52] U.S. Cl. .................................. 257/416; 257/419; 257/459; 257/466; 310/313 R
[58] Field of Search ............... 257/431, 466, 416, 419, 257/459, 212, 415, 82; 310/313 R

[56] References Cited

U.S. PATENT DOCUMENTS

| | | | |
|---|---|---|---|
| 3,568,079 | 3/1971 | Yoder | 257/416 |
| 3,871,017 | 3/1975 | Pratt, Jr. | 257/431 |
| 3,944,732 | 3/1976 | Kino | 257/431 |
| 4,028,548 | 6/1977 | Scott | 257/416 |
| 4,084,192 | 4/1978 | Defranould et al. | 257/431 |
| 4,181,904 | 1/1980 | Weller et al. | 257/416 |
| 4,469,977 | 9/1984 | Quinn et al. | 257/22 |
| 5,101,294 | 3/1992 | Jain et al. | 385/7 |
| 5,130,843 | 7/1992 | He et al. | 257/416 |
| 5,166,766 | 11/1992 | Grudkowski et al. | 257/416 |

FOREIGN PATENT DOCUMENTS 0399327 11/1990 European Pat. Off. ............ 257/416
2242086 2/1991 United Kingdom ................ 257/416

OTHER PUBLICATIONS

Fowler et al., "Acoustic to visible image converter", IBM Technical Disclosure Bulletin, vol. 13, No. 3, Aug. 1970.
Fang et al., "Acoustic wave amplifier having a coupled semiconductor laser", IBM Tech. Dis. Bul., vol. 13, No. 11, Apr. 1971.
Patent Abstracts of Japan, vol. 13, No. 195, May 10, 1989, & JP-A-01 014 980, Jan. 19, 1989, Takashi.
"Coherent Nonequilibrium Phonos: An Induced Peierls Distortion", David A. Williams, The American Physical Society, Oct. 26, 1992, vol. 69, No. 17, pp. 2551-2554.
"One Dimensional Conductors", S. Kagoshima, et al., Springer Series in Solid-State Sciences 72, pp. 5-21, and p. 221, 1972.

Primary Examiner—Rolf Hille
Assistant Examiner—Minhloan Tran
Attorney, Agent, or Firm—Kenyon & Kenyon

[57] ABSTRACT

A controlled conductivity device utilizes incident phonons (1) to control conductivity. A body of material (2) is capable of changing its conductivity in response to the incident phonons by undergoing a metal-insulator transition.

14 Claims, 2 Drawing Sheets

PHONON CONTROLLED CONDUCTIVITY DEVICE

FIELD OF THE INVENTION

This invention relates to a phonon controlled conductivity device which has particular application to quantum microcircuits.

BACKGROUND OF THE INVENTION

In conventional microcircuits, large numbers of electrons flow and their collective action can be characterised in terms of conventional current. However, in quantum microcircuits, the dimensions of circuit component parts are constructed to be sufficiently small that the flow of individual electrons is controlled and the behaviour of the electrons needs to be described in terms of their quantum mechanical wavefunctions.

With such very small circuits, problems arise in providing external connections for control signals that are used to perform logical switching.

SUMMARY OF THE INVENTION

In accordance with the present invention, it has been appreciated that by feeding phonons into a conduction channel, a Peierls transition can be induced, which alters the conductivity of the channel. The phase transition can thus be an artificial. Also, the injected phonons may be used to induce a superconducting state at an arbitary temperature, so as to alter the conductivity. Thus, the present invention seeks to induce artificially a Peierls transition by applying phonons to a suitable body of material.

More particularly, in accordance with the present invention there is provided a phonon controlled conductivity device, comprising a body of material which undergoes a Peierls transition in response to incident phonons, and control means for selectively directing phonons into said body of material so as to produce a Peierls transition and change selectively the conduction characteristics thereof.

The device can operate as a switch in which the phonons switch the electrical conductivity of the body of material from a first to a second different conductivity condition.

The device can also operate as an electron phase selector, in which the phonons mode-lock the phase of electrons in the body of material. In this way, it is possible to control the phase of electrons travelling in a conduction channel formed from the body of material.

The phonons may be generated by directing continuous or pulsed laser energy onto a suitable substrate so as to produce photon-electron interactions, resulting in the generation of a stream of coherent phonons. The interaction can be amplified and tuned with a surface grating structure and by predetermining the lattice structure, orientation and composition.

Coherent phonons may also be created by a surface acoustic wave device.

BRIEF DESCRIPTION OF THE DRAWINGS

In order that the invention may be more fully understood, embodiments thereof will now be described by way of example with reference to the accompanying drawings in which.

DETAILED DESCRIPTION

Figure 1:
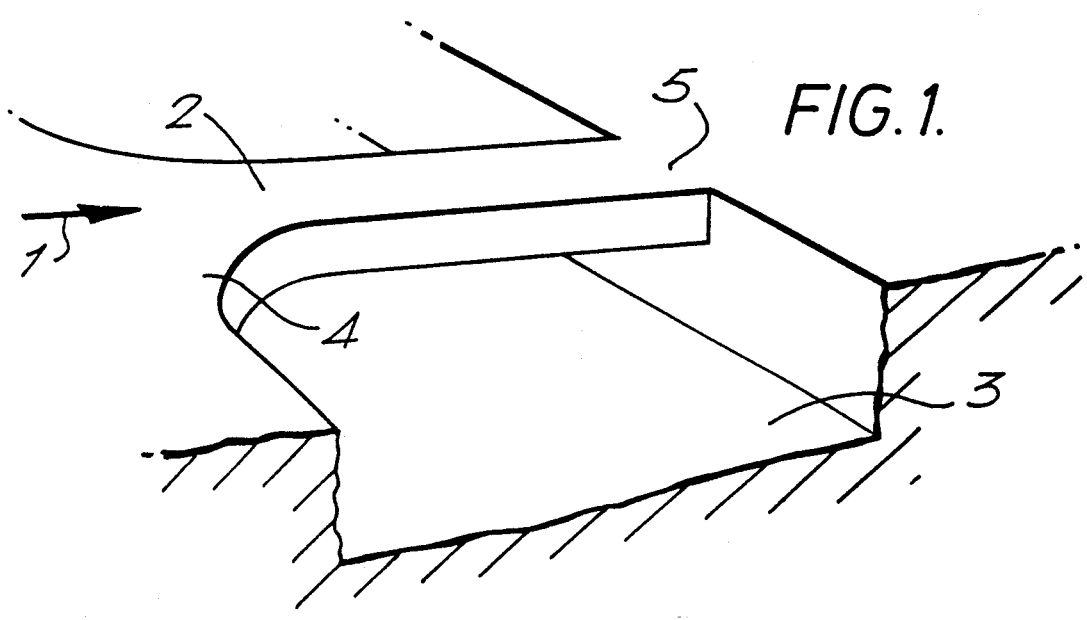
FIG. 1 is a schematic perspective view of a conduction channel in the form of a free standing wire, which receives coherent phonons to produce metal-insulator switching.

Referring to FIG. 1, coherent phonons from a source (not shown) are directed in the direction of arrow 1 into a body of material consisting of a free standing semiconductor wire 2 which bridges a trough 3 formed in a semiconductor substrate. The wire 2 can be formed of single crystal semiconductor material by conventional semiconductor fabrication techniques. The wire 2 is connected in an electrical circuit (not shown) so as to act as a logic element. The circuit may thus include a large number of wires 2 each individually switchable by a respective source of phonons to perform individual logic functions.

In use, the coherent phonons 1 induce a metal-insulator transition in the wire 2 so as to change its conductivity between a relatively non conducting and a relatively conducting condition or vice versa. Metal-insulator transitions in materials are known per se, and occur naturally e.g. in response to temperature change in a semiconductor. Such transitions as known are Peierls transitions. In accordance with the invention, the incident coherent phonons artificially induce such a transition and thereby change the conductivity of the wire 2.

Also, by a suitable selection of temperature, the phonons can be utilised to induce a superconducting state, thereby to switch the conductivity of the wire.

Figure 2:
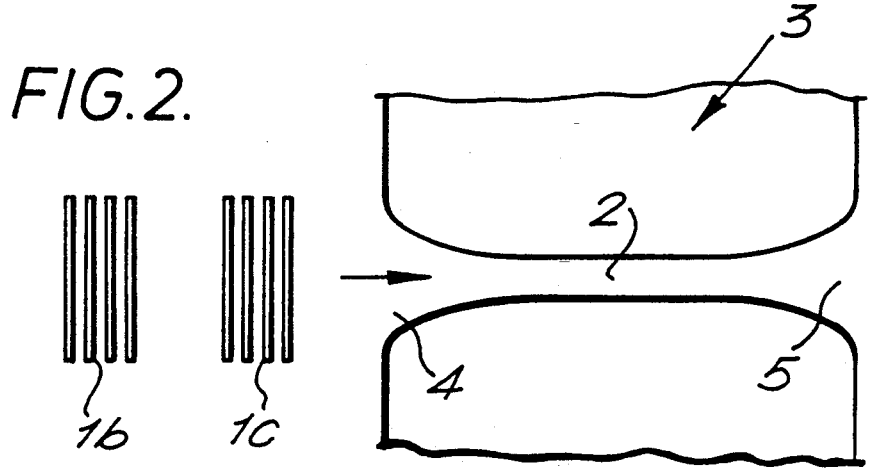
FIG. 2 is a plan view corresponding to FIG. 1 in which the conduction channel has a fluted entry and exit.

In one embodiment, the wire 2 has a fluted entry region 4 so as to allow the phonons to enter the wire 2 adiabatically (i.e. with no mode mixing) whereas the opposite end 5 defines an abrupt transition from which the incident phonons are reflected so as to produce a standing wave in the wire. The resulting standing wave can be of a sufficient amplitude to induce the metal-insulator transition. Alternatively, as shown in FIG. 2, the entry and exit for the wire 2 both have fluted ends. The coherent phonons are applied in pulses 1a, b, c so as to establish a travelling wave through the wire 2 which can be used to switch the conductivity in the wire dynamically. The phonons leaving the exit 5 could be used to switch another wire arranged downstream.

Figure 3:
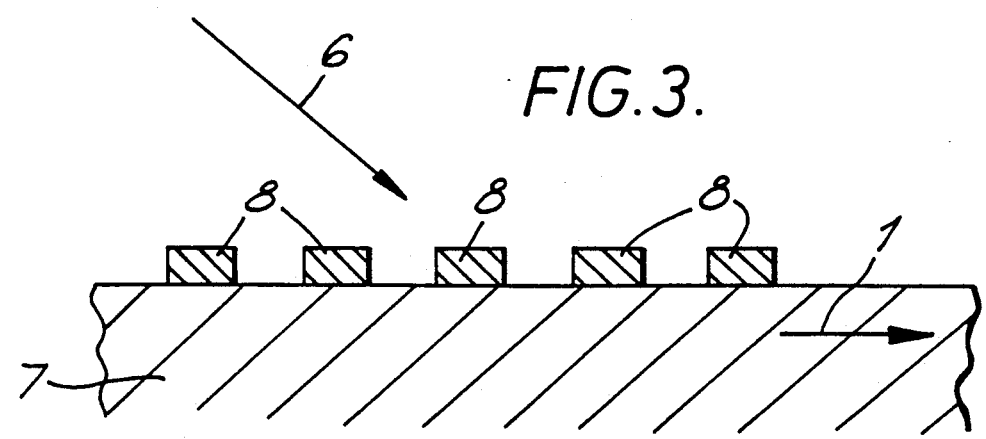
FIG. 3 is a schematic sectional view of a coherent phonon source utilising incident laser radiation.

Referring to FIG. 3, the coherent phonons can be created by the interaction between an incident laser beam 6 and electrons in a solid material 7. The interaction can be amplified and tuned with a surface grating structure 8, and by predetermining the lattice structure, orientation and composition of the material 7. The incoming laser beam 6 creates a varying electric field in the underlying lattice of material 7, which in turn creates phonons predominantly with the same wavelength, which move in the direction of arrow 1. Preferably, a piezoelectric material is used for lattice structure 7.

Figure 4:
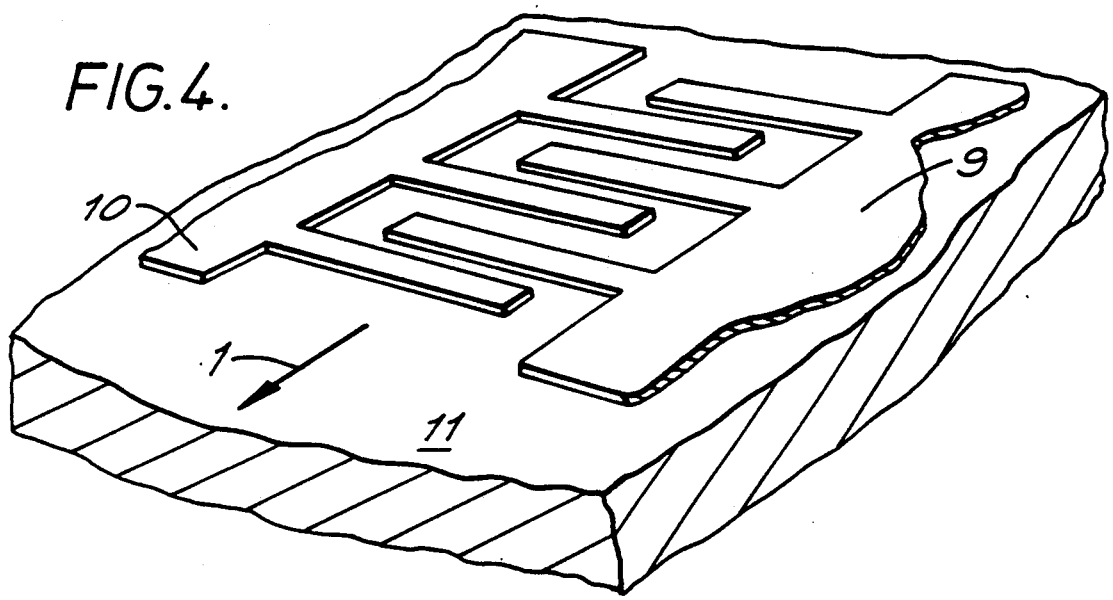
FIG. 4 is a schematic perspective view of a surface acoustic wave device for generating coherent phonons.

Referring to FIG. 4, coherent phonons can also be produced by means of a surface acoustic wave device. This consists of first and second sets of interdigitated electrodes 9,10 formed on a piezoelectric substrate 11. By applying oscillatory signals to the electrodes 9,10, a travelling acoustic wave can be established in the piezoelectric substrate 11 in such a manner as to produce coherent phonons in the direction of arrow 1.

Figure 5:
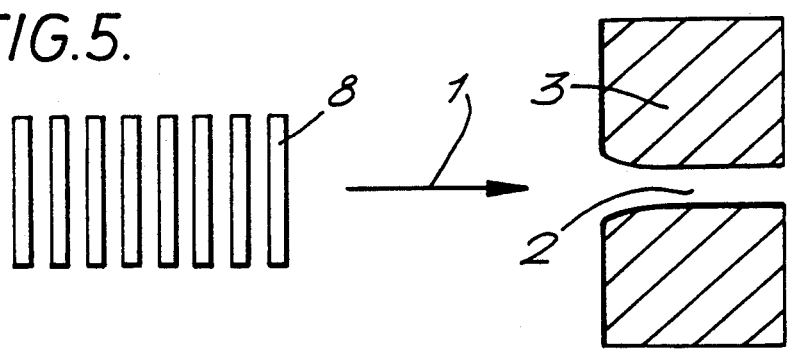
FIG. 5 is a schematic plan view of an optoelectronic coupling arrangement utilising the laser operated phonon source of FIG. 3 and the conduction channel of FIG. 1.

Referring to FIG. 5, this shows an optoelectronic switch which consists of the laser source of FIG. 3 and the wire structure of FIG. 1. Thus, in use, a laser is directed onto the grating 8 so as to produce coherent phonons which switch the conductive state of wire 2 from a conducting to a non-conducting condition. In the absence of phonons, the wire assumes a conducting state. In practice, the wire 2 is connected by microcircuit conductive structures to other logic elements in order to provide an integrated microcircuit.

Figure 6:
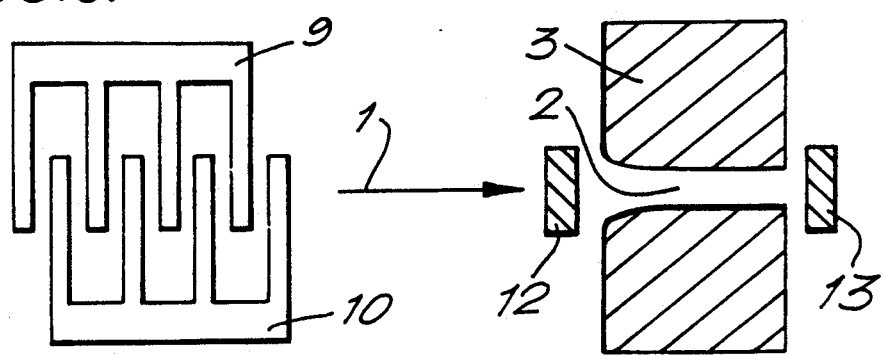
FIG. 6 is a schematic plan view of a phonon coupled relay utilising the surface acoustic wave device of FIG. 4 and the conduction channel of FIG. 1.

FIG. 6 shows a relay device comprising the surface acoustic wave phonon source of FIG. 4 coupled to the wire structure of FIG. 1. Thus, when oscillatory signals are applied to electrodes 9,10, the resulting phonons 1 switch the wire 2 from a conductive condition. As explained with reference to FIG. 5, the wire 2 may be connected by microcircuit structures in an integrated circuit but in FIG. 6, schematic source and drain conductive regions, 12,13 are shown to indicate diagrammatically how the conductivity of wire 2 may be sensed.

Furthermore, in addition to controlling the bulk conductivity of the material of wire 2, it is considered that the coherent phonons will mode-lock the permitted phase of electron conduction through the wire 2. It is known that propogation of electrons or other carriers in a conduction wire under certain circumstances can be considered as a charge density wave (CDW) and the phase and wavelength of the CDW is a function of the lattice condition. Thus, by injecting phonons into the lattice structure, the phase and wavelength of charge carriers that can pass along the channel, can be controlled. Thus, the device can be used as a phase selector and thus can be used as a phase control element for example to perform logic functions as described in our co-pending specification GB-A-2242086.

Various modifications fall within the scope of the invention. For example, the conduction channel may comprise a mesa rather than a wire, or be fabricated in bulk material. Whilst the described examples utilise a conduction channel of single crystal semiconductor material, a suitable phonon generated switching may be achievable in a polycrystalline metal wire.

The invention has the advantage that the amplitude of phonons from the described phonon sources can be made much greater than that of thermally generated phonons so that the device is potentially operable at room temperature.

What is claimed is:

1. A phonon control conductivity device comprising: a body of material having a first relatively high conductivity condition and a second relatively low conductivity condition, the material being caused to undergo a Peierls transition between said first and second conductivity conditions by phonons entering the material;

means for establishing a path for the passage of charge carriers through the body of material; and control means for selectively directing phonons into said body of material to cause said Peierls transition to occur so as to selectively change the conductivity thereof between said first and second conductivity wherein the conductivity of said path along which the charge carriers travel is altered.

2. The device according to claim 1 operative as a switch wherein the phonons switch the electrical conductivity of the body of material from a first to a second different conductivity condition.

3. The device according to claim 2 wherein said phonons directed by said control means are operative to induce a metal-insulator transition in said body of material.

4. The device according to claim 2 wherein said phonons directed by said control means are operative to induce a superconducting state in said body of material.

5. The device according to claim 1 operative as an electron phase selector, wherein said control means is configured to direct coherent phonons into the body of material such as to mode-lock the phase of electrons therein.

6. The device according to claim 1 wherein the body of material includes a trough bridged by a wire, said phonons being directed into the wire to control the conduction characteristics thereof.

7. The device according to claim 1 wherein the body of material includes a mesa into which said phonons are directed.

8. The device according to claim 1 wherein said body of material comprises bulk material into which the phonons are directed.

9. The device according to claim 1 wherein said control means includes a surface acoustic wave device adapted to generate coherent phonons.

10. The device according to claim 9 wherein said surface acoustic wave device includes a piezoelectric substrate, and interdigitated electrodes for generating coherent phonons in the substrate.

11. The device according to claim 1 wherein said control means includes means, responsive to incident optical radiation, for generating coherent phonons.

12. The device according to claim 11 wherein said means for generating coherent phonons including a source of laser radiation, and a substrate to receive said radiation for generating said phonons.

13. The device according to claim 12 wherein said substrate is formed with a grating on to which the laser radiation is directed.

14. The device according to claim 1 including a source and a drain in a substrate in said body of material for defining said charge carrier path.

* * * * *